(12) United States Patent
Kumar (10) Patent No.: US 11,874,788 B1
(45) Date of Patent: Jan. 16, 2024

(54) TRANSMITTER ARCHITECTURE FOR HIGH SPEED MEMORY INTERFACES

(71) Applicant: Cadence Design Systems, Inc., San Jose, CA (US)

(72) Inventor: Vinod Kumar, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/848,725

(22) Filed: Jun. 24, 2022

(51) Int. Cl.
  *G06F 13/40* (2006.01)
  *H03K 19/1776* (2020.01)
  *H03K 19/017* (2006.01)
  *G06F 13/16* (2006.01)

(52) U.S. Cl.
  CPC ...... *G06F 13/4072* (2013.01); *G06F 13/1689* (2013.01); *H03K 19/01742* (2013.01); *H03K 19/1776* (2013.01)

(58) Field of Classification Search
  CPC ............ G06F 13/4072; G06F 13/1689; H03K 19/01742; H03K 19/1776
  See application file for complete search history.

(56) References Cited

U.S. PATENT DOCUMENTS

| | | | |
|---|---|---|---|
| 2016/0204768 A1* | 7/2016 | Luo | H03K 3/012 327/108 |
| 2018/0191534 A1* | 7/2018 | Rane | H04L 25/03038 |
| 2018/0343064 A1* | 11/2018 | Kawaai | H04B 10/588 |
| 2019/0137842 A1* | 5/2019 | Islam | H04B 10/548 |
| 2019/0287584 A1* | 9/2019 | Hollis | H01L 25/0657 |
| 2020/0036402 A1* | 1/2020 | Kansal | H03L 7/099 |
| 2022/0083244 A1* | 3/2022 | Um | G11C 7/1051 |
| 2022/0121582 A1* | 4/2022 | Jin | G06F 13/4234 |

* cited by examiner

*Primary Examiner* — Phong H Dang (74) *Attorney, Agent, or Firm* — Mark H. Whittenberger; Holland & Knight LLP (57) ABSTRACT

Embodiments included herein are directed towards a transmitter circuit. The circuit may include a most significant bit ("MSB") main driver and a most significant bit boost driver operatively connected to the MSB main driver. The circuit may also include a least significant bit ("LSB") main driver and a least significant bit boost driver operatively connected to the LSB main driver, wherein the MSB main driver and the LSB main driver are configured to receive two parallel non-return-to-zero ("NRZ") data inputs.

18 Claims, 8 Drawing Sheets

| NRZ Input data to PAM4 Transmitter | | PAM4 Data at Transmitter Output (PAD) |
|---|---|---|
| IMSB | ILSB | |
| 0 | 0 | Level0 |
| 0 | 1 | Level1 |
| 1 | 0 | Level2 |
| 1 | 1 | Level3 |

FIG. 6

| Previous Data | | | Present Data | | | Effective Boost Driver Strength during transition from Previous data to Present Data |
|---|---|---|---|---|---|---|
| IMSB | ILSB | PAD | IMSB | ILSB | PAD | |
| 0 | 0 | Level0 | 0 | 1 | Level1 | 1X Boost |
| 0 | 0 | Level0 | 1 | 0 | Level2 | 2X Boost |
| 0 | 0 | Level0 | 1 | 1 | Level3 | 3X Boost |
| 0 | 1 | Level1 | 0 | 0 | Level0 | 1X Boost |
| 0 | 1 | Level1 | 1 | 0 | Level2 | 1X Boost |
| 0 | 1 | Level1 | 1 | 1 | Level3 | 2X Boost |
| 1 | 0 | Level2 | 0 | 0 | Level0 | 2X Boost |
| 1 | 0 | Level2 | 0 | 1 | Level1 | 1X Boost |
| 1 | 0 | Level2 | 1 | 1 | Level3 | 1X Boost |
| 1 | 1 | Level3 | 0 | 0 | Level0 | 3X Boost |
| 1 | 1 | Level3 | 0 | 1 | Level1 | 2X Boost |
| 1 | 1 | Level3 | 1 | 0 | Level2 | 1X Boost |

TRANSMITTER ARCHITECTURE FOR HIGH SPEED MEMORY INTERFACES

FIELD OF THE INVENTION

The present disclosure relates to electronic circuit transmission architecture, and more particularly, to a transmitter architecture for high speed memory interfaces (e.g., Pulse Amplitude Modulation 4-level ("PAM4").

BACKGROUND

Emerging technologies like three dimensional ("3D") gaming, artificial intelligence ("AI"), high-performance computing ("HPC"), graphics applications and advanced driver assistance systems often require very high bandwidth memory interfaces.

As the speed goes higher the channel starts limiting the bandwidth of the interface for NRZ ("Non-Return-to-Zero") signaling. NRZ signaling is binary signaling. In NRZ signaling only two bits of information are transmitted in a clock cycle. The maximum data rate for NRZ signaling is 2*Clock Frequency. To get the 32 Gbps data rate in NRZ signaling the clock frequency needs to be 16 GHz which requires the channel bandwidth >16 GHz. Most of the memory interface channel bandwidth is less than 10 GHz and hence it has become very difficult to transfer NRZ data on memory interface channels beyond a 20 Gbps data rate.

Therefore, high bandwidth memories such as Graphics Double Data Rate 6X Synchronous Dynamic Random-Access Memory ("GDDR6X") and ("GDDR7") are using PAM4 signaling to obtain the higher bandwidth for the interface. In PAM4 signaling the amplitude of the signal is modulated to transmit 4-bits of information per clock cycle. Therefore, for 32 Gbps PAM4 signaling the maximum frequency of the clock will be 8 Ghz which requires a channel bandwidth >=8 GHz which can be easily achieved.

SUMMARY

In one or more embodiments of the present disclosure, a transmitter circuit is provided. The circuit may include a most significant bit ("MSB") main driver and a most significant bit boost driver operatively connected to the MSB main driver. The circuit may also include a least significant bit ("LSB") main driver and a least significant bit boost driver operatively connected to the LSB main driver, wherein the MSB main driver and the LSB main driver are configured to receive two parallel non-return-to-zero ("NRZ") data inputs.

One or more of the following features may be included. The transmitter circuit may generate a pulse amplitude modulation 4-level ("PAM 4") compliant output signal. A drive strength of the MSB main driver may be twice a drive strength of the LSB main driver. A first NRZ data input may be received at the MSB main driver and the MSB boost driver. A second NRZ data input may be received at the LSB main driver and the LSB boost driver. The two parallel NRZ data inputs may be generated at a serializer. The MSB main driver and LSB main driver may be connected in parallel. The MSB boost driver may apply a boost based upon, at least in part, a PAM4 transition level. The serializer may be an 8-bit input data serializer at an X/8 rate, wherein "X" is full speed. The two parallel NRZ data inputs may be provided at an X/2 rate, wherein "X" is full speed.

In one or more embodiments of the present disclosure, a PAM 4 data transmission method is provided. The method may include providing a most significant bit ("MSB") main driver and a most significant bit boost driver operatively connected to the MSB main driver. The method may further include providing a least significant bit ("LSB") main driver and a least significant bit boost driver operatively connected to the LSB main driver. The method may also include receiving two parallel non-return-to-zero ("NRZ") data inputs at the MSB main driver and the LSB main driver and generating a PAM4 output signal.

One or more of the following features may be included. At least one of the MSB main driver and the LSB main driver may include a pull-up pre-driver, a pull-down pre-driver, and a PVT compensated output driver. A drive strength of the MSB main driver may be twice a drive strength of the LSB main driver. A first NRZ data input may be received at the MSB main driver and the MSB boost driver. A second NRZ data input may be received at the LSB main driver and the LSB boost driver. The two parallel NRZ data inputs may be generated at a serializer. The MSB main driver and LSB main driver may be connected in parallel. The MSB boost driver may apply a boost based upon, at least in part, a PAM4 transition level. The serializer may be an 8-bit input data serializer at an X/8 rate, wherein "X" is full speed. The two parallel NRZ data inputs may be at an X/2 rate, wherein "X" is full speed.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. Like reference numerals in the drawings denote like elements.

Embodiments included herein are directed towards a PAM4 transmitter architecture for high-speed memory interfaces like GDDR6X and GDDR7, which may support PAM4 signaling.

Figure 1:
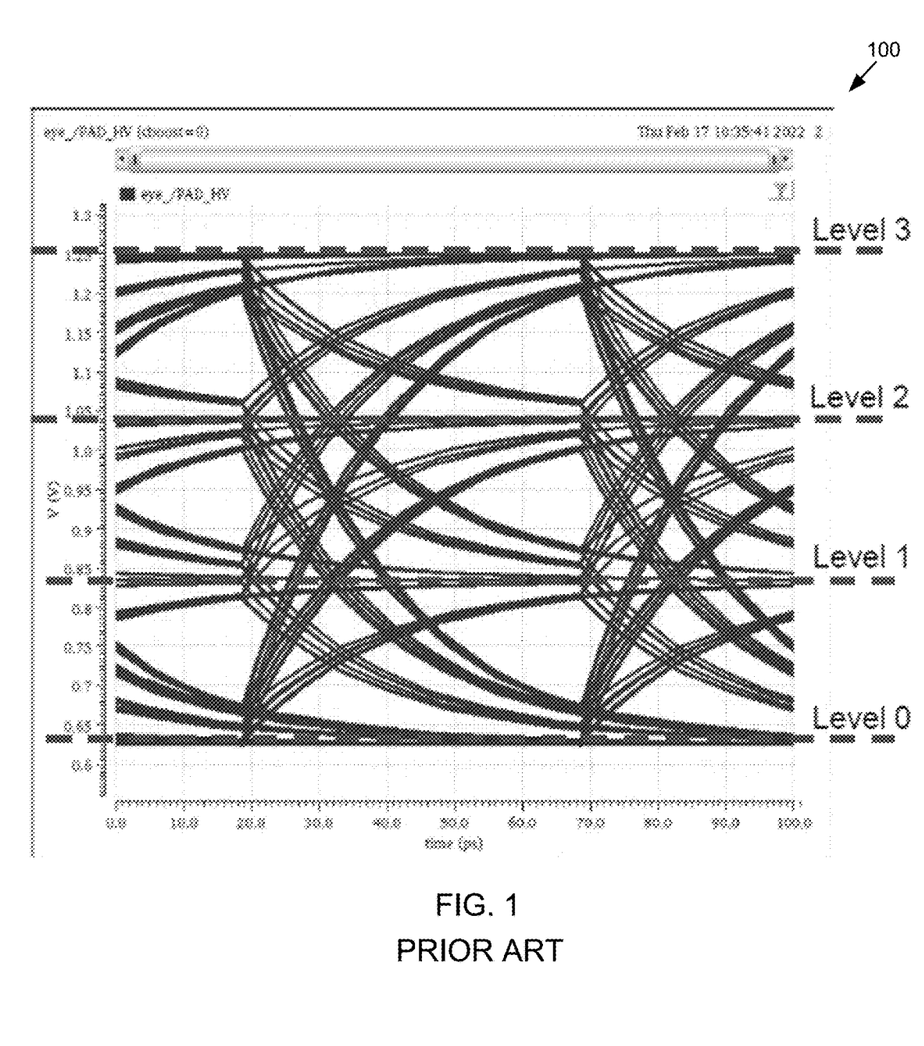
FIG. 1 is a graphical user interface showing some of the challenges facing existing approaches that utilize PAM4 signaling (specifically an eye diagram of an ideal PAM4 transmission at 40 Gbps data rate without equalization)

Referring now to FIG. 1, an eye diagram 100 of an ideal PAM4 transmission at 40 Gbps data rate without equalization is provided. The eye diagram of a signal represents the plot of a signal overlapped after each unit interval ("UI"). The levels of a PAM4 signal represent the signal amplitude level carrying 1-bit information. Levels 0-3 represent 4 different amplitude levels and hence 4-bits of information. In PAM4 signaling the per bit signal amplitude is ⅓ of the per bit amplitude in NRZ signaling. The limited voltage slew of the transmitter reduces the eye opening of the bits in PAM4 signaling, particularly for Level 0 to Level 3 transitions and vice versa. The lower eye opening for the bit makes it difficult for the PAM4 receiver to detect the signal correctly. The loss in data eye due to voltage slew limits the speed of the PAM4 memory interface. A fixed voltage slew boosting scheme is unlikely to work for PAM4 signaling as it will over equalize the Level 0 to Level 1 transition.

Accordingly, embodiments of the present disclosure are directed towards a new architecture of a PAM4 transmitter which includes transition level dependent slew control. In this way, any loss in the PAM4 signal eye due to voltage slew may be recovered.

Figure 2:
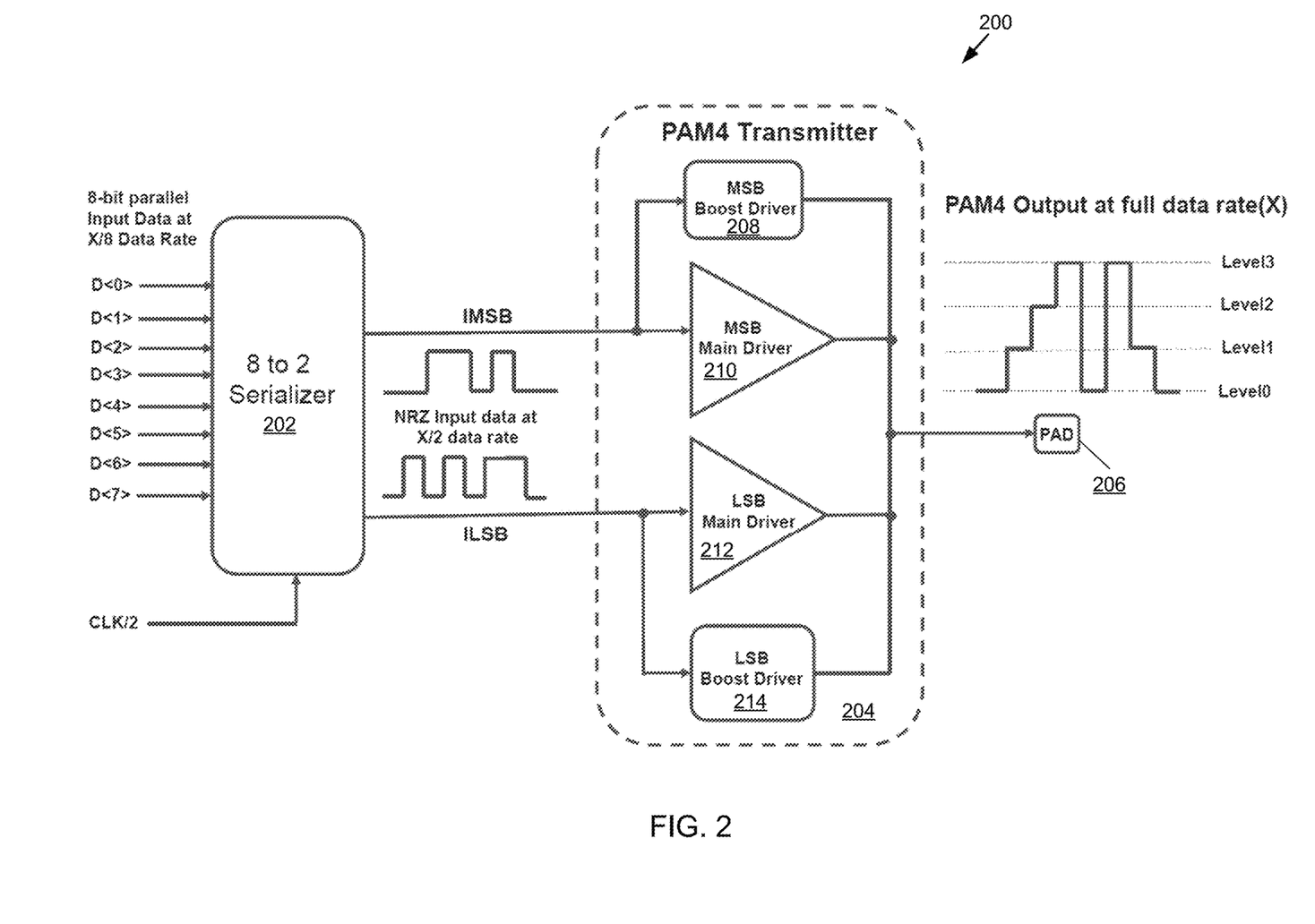
FIG. 2 is a block diagram consistent with embodiments of the present disclosure.

Referring now to FIGS. 2-8 embodiments of the present disclosure showing aspects of the PAM4 transmitter architecture are provided. FIG. 2 depicts a block diagram 200 including serializer 202, transmitter 204, and pad 206. Transmitter 204 may include MSB boost driver 208, MSB main driver, 210, LSB main driver 212, and LSB boost driver 214.

In some embodiments, serializer 202 may be an 8 to 2 serializer configured to receive a clock signal and input data. For example, an 8-bit parallel input data stream at an X/8 data rate may be received in some embodiments. Serializer 202 may then generate one or more output data streams such as the IMSB and ILSB data streams discussed in further detail hereinbelow.

In some embodiments, and as shown in FIG. 2, the transmitter architecture included herein may utilize two parallel NRZ data inputs (e.g., IMSB and ILSB) to generate the PAM4 signal at output PAD 206. In operation, the input data IMSB goes to MSB main driver 210. The input data ISLB goes to LSB main driver 212. In some embodiments, the drive strength of MSB driver 210 may be twice the drive strength of LSB driver 212.

In some embodiments, the present disclosure includes a signal transition boosting based scheme for a PAM4 transmitter. Referring again to FIG. 2, MSB boost driver 208 may be configured to receive input data IMSB and LSB boost driver 214 configured to receive input data ILSB.

Figure 3:
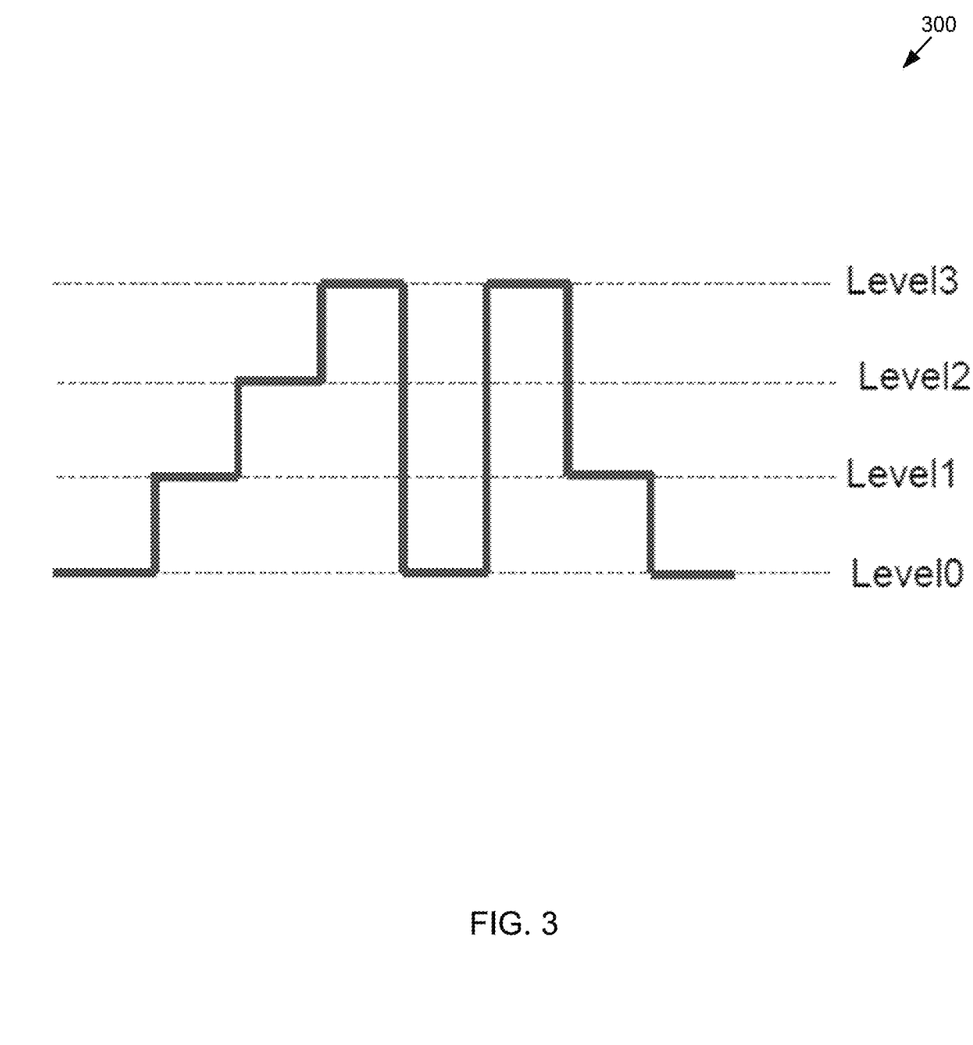
FIG. 3 is a plot showing examples of transition level dependent boosting to equalize PAM4 transitions consistent with embodiments of the present disclosure.

Referring now to FIG. 3, a plot showing examples of transition level dependent boosting to equalize the PAM4 transitions is provided. In this example, between Level 0 to Level 1 transitions → 1X Boost. Between Level 0 to Level 2 transitions → 2X Boost. Between Level 0 to Level 3 transitions → 3X Boost. Between Level 1 to Level 2 transitions → 1X Boost. Between Level 1 to Level 3 transitions → 2X Boost. Between Level 2 to Level 3 transitions → 1X Boost. The term "boost", as used herein, may represent the acceleration of a signal transition. Increasing the boost level will make the signal transition faster.

Figure 4:
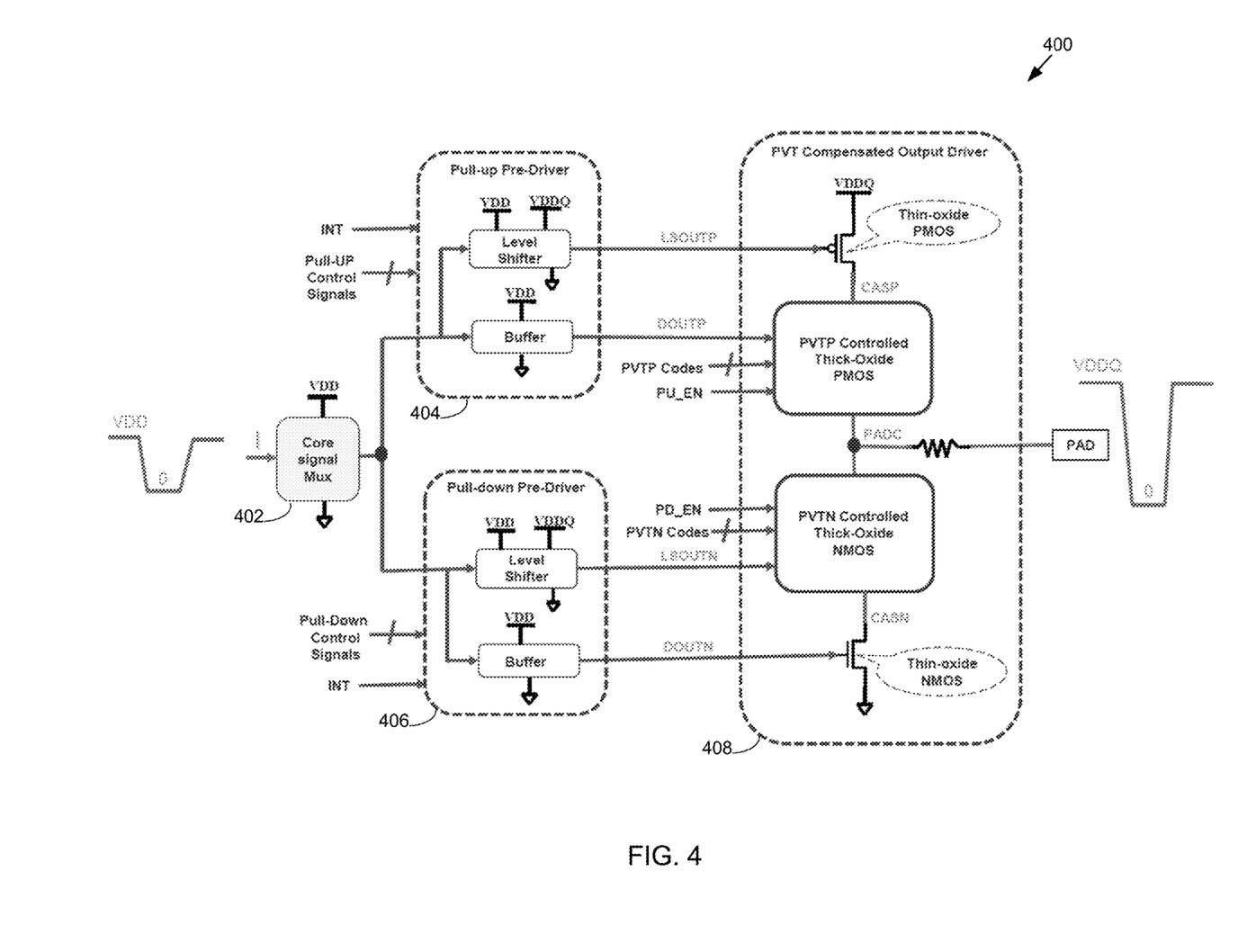
FIG. 4 is a block diagram consistent with embodiments of the present disclosure.

Referring now to FIG. 4, a block diagram 400 showing an example of a main driver consistent with embodiments of the present disclosure is provided. The main driver may include a core signal multiplexer, pull-up pre-driver 404, pull-down pre-driver 406, and PVT compensated output driver 408. Main driver 400 may be directly connected to the PAD via a resistive path and hence may determine the static voltage level of the PAM4 signal amplitude at the PAD. Pull-up pre-driver 404 and pull-down pre-driver 406 may each include level shifter circuits which may be used to voltage level shift the input core signal of the VDD supply domain into the output voltage level of the VDDQ supply domain. The buffer circuit in pull-up pre-driver 404 and pull-down pre-driver 406 may be used to match the propagation delay of the level shifter circuit. PVT compensated output driver 408 may provide a well-controlled output drive strength whose Process, Voltage and Temperature (PVT) dependent variation may be compensated by using PVT dependent calibration codes PVTP and PVTN.

Figure 5:
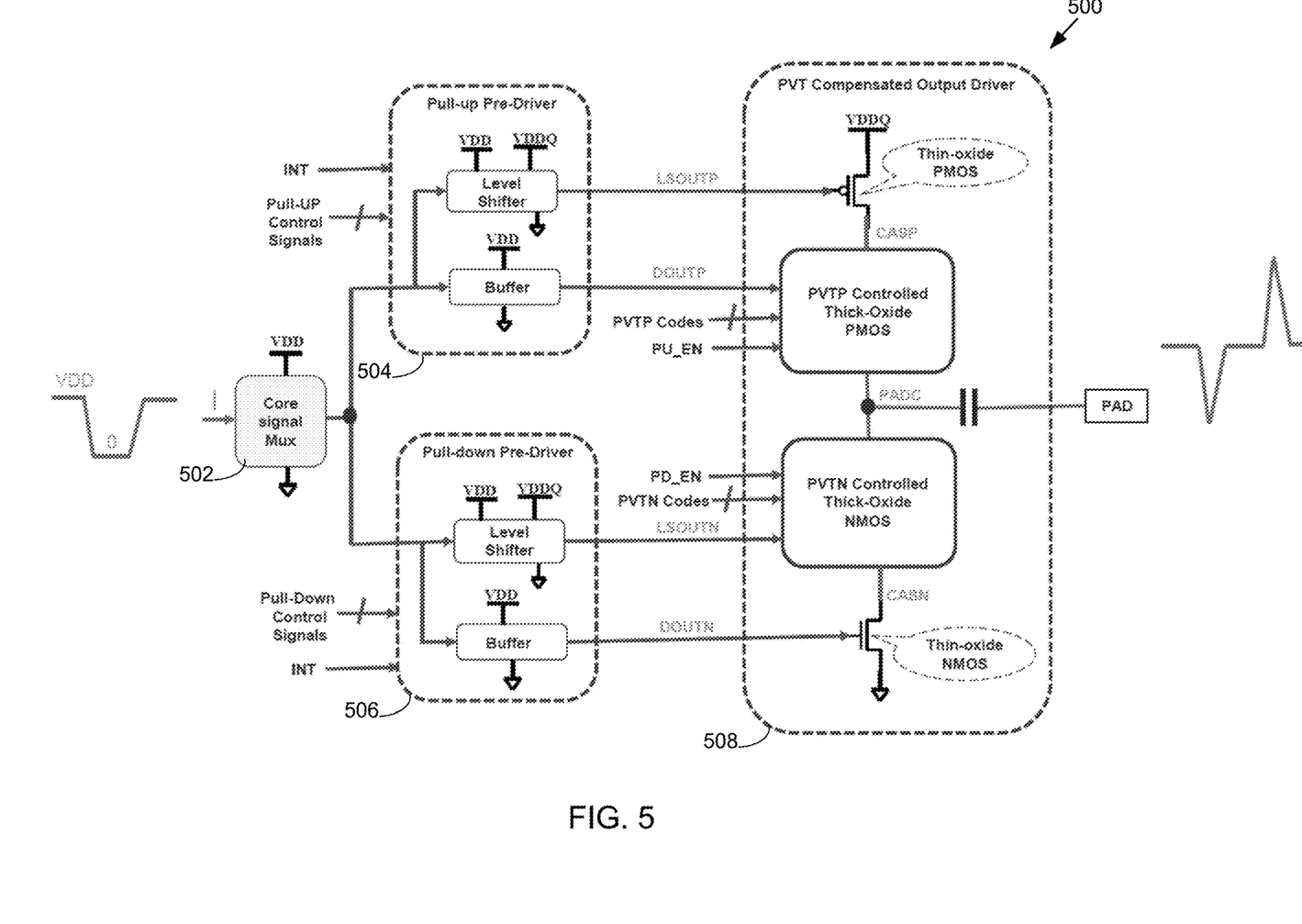
FIG. 5 is a block diagram consistent with embodiments of the present disclosure.
Figure 6:
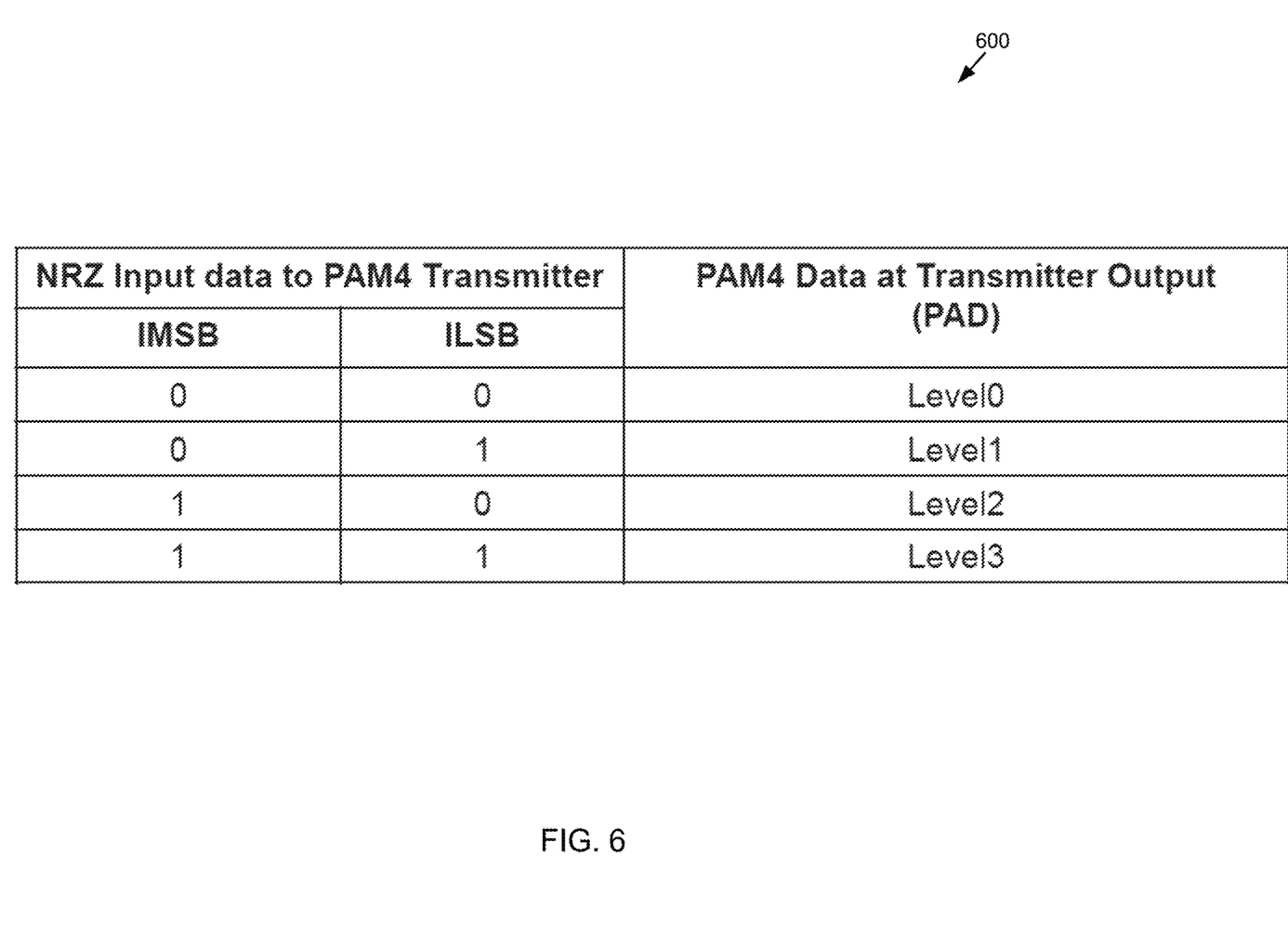
FIG. 6 is a table consistent with embodiments of the present disclosure.
Figure 7:
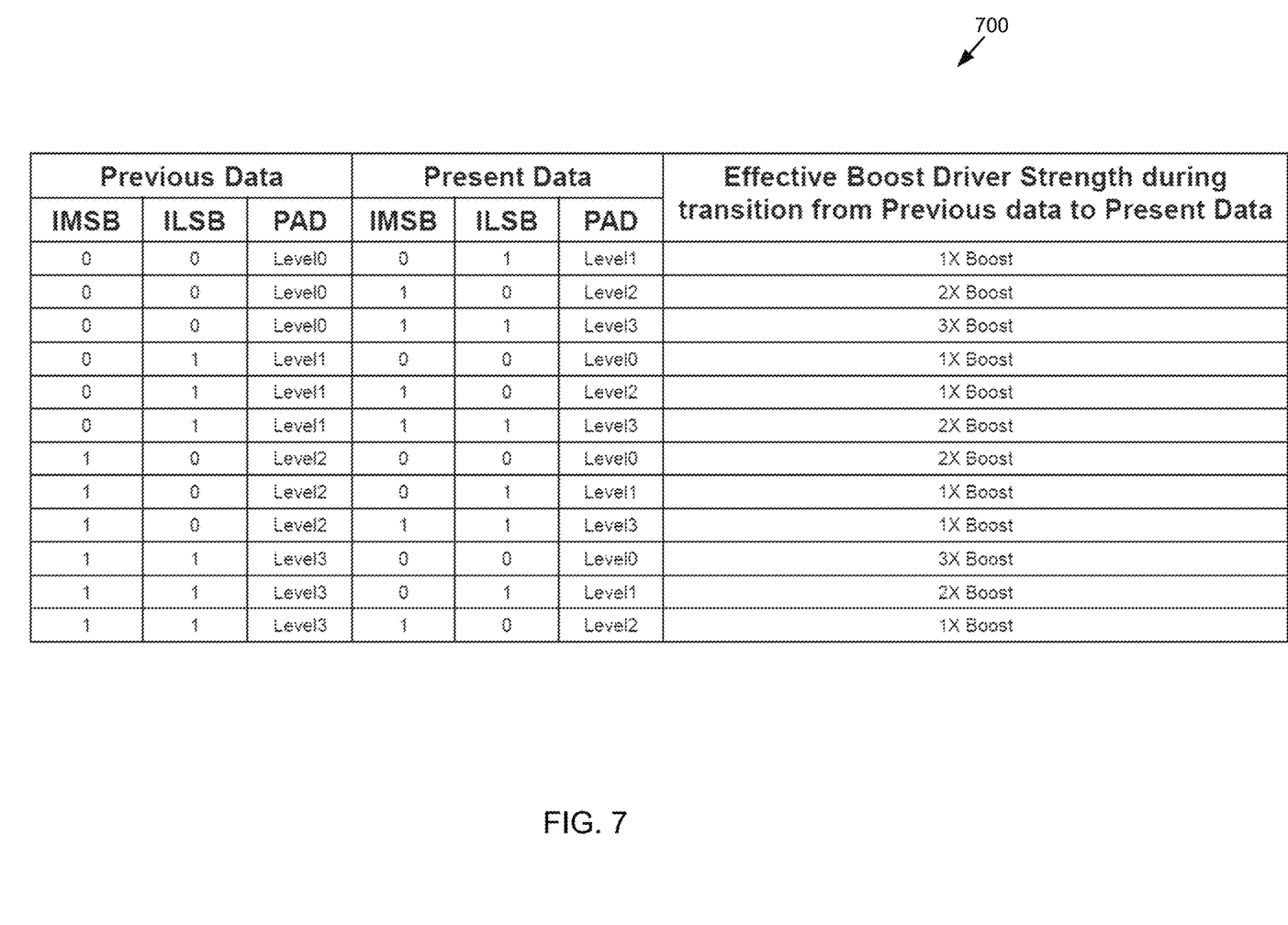
FIG. 7 is a table consistent with embodiments of the present disclosure.

Referring now to FIG. 5, a block diagram 500 showing an example of a boost driver consistent with embodiments of the present disclosure is provided. The boost driver may include a core signal multiplexer 502, pull-up pre-driver 504, pull-down pre-driver 506, and PVT compensated output driver 508. The boost driver output may be capacitive coupled to the PAD and hence may change only the transition time of the signal at the PAD. Due to capacitive coupling boost driver 500 may not affect the static voltage level of the PAM4 signal amplitude at the PAD. Pre-driver circuits 504 and 506 of boost driver 500 may also include level shifter circuits to voltage level shift the input core signal of the VDD supply domain into the output voltage level of VDDQ supply domain. The buffer circuit may be used in the pre-driver circuits to match the propagation delay of the level shifter circuit. The impedance of output driver 508 may be PVT compensated by using the Process, Voltage and Temperature (PVT) dependent calibration codes PVTP and PVTN.

In operation, serializer 202 may be used to convert an 8-bit parallel input data stream at X/8 speed into 2 bit parallel output data at X/2 speed, which is given as NRZ input data to the PAM4 transmitter 204 to generate PAM4 output at full speed (X). For a GDDR7 Application the speed "X" of a PAM4 transmitter may be as high as 40 Gbps. The drive strength of MSB main driver 210 may be twice of the drive strength of LSB main driver 212. MSB main driver 210 and LSB main driver 212 may be connected in parallel at PAD 206 to generate the PAM4 modulation at the transmitter output. Depending upon the NRZ input data IMSB and ILSB the signal at transmitter output (PAD) may be amplitude modulated to generate the PAM4 output at PAD 206 as provided in FIG. 6. The boost driver may be used to increase the transition slope during data switching. The boosting strength of MSB boost driver 208 may be twice of the boosting strength of LSB boost driver 214. The effective boosting strength at PAD 206 may be automatically adjusted based on transition level as provided in FIG. 7. Where 1X Boost represents the minimum boosting strength. 2X Boost represents the medium boosting strength which is twice of the minimum boosting strength. 3X Boost represents the maximum boosting strength which is thrice of the minimum boosting strength.

Figure 8:
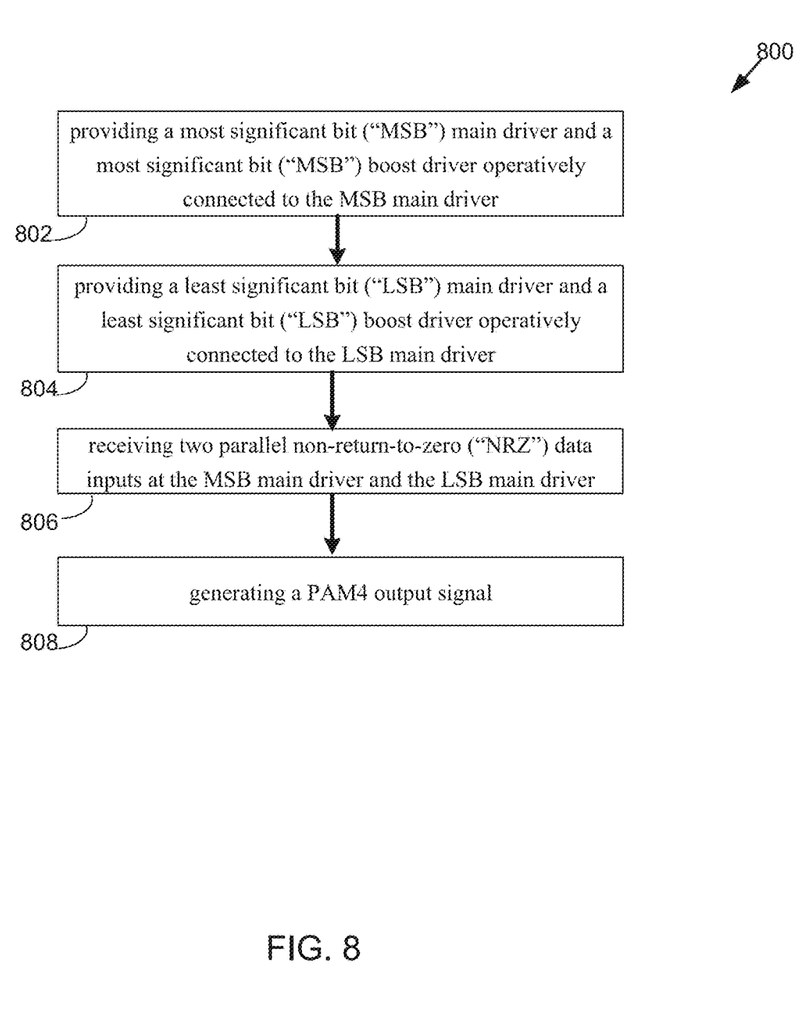
FIG. 8 is an example flowchart according to an embodiment of the present disclosure.

Referring now to FIG. 8, a flowchart depicting operations consistent with a PAM 4 data transmission method is provided. The method may include providing (802) a most significant bit ("MSB") main driver and a most significant bit boost driver operatively connected to the MSB main driver. The method may further include providing (804) a least significant bit ("LSB") main driver and a least significant bit boost driver operatively connected to the LSB main driver. The method may also include receiving (806) two parallel non-return-to-zero ("NRZ") data inputs at the MSB main driver and the LSB main driver and generating (808) a PAM4 output signal. Numerous other operations are also within the scope of the present disclosure.

Embodiments of the transmitter architecture discussed herein makes it possible to design the transmitter for high-speed memory interfaces like GDDR6X and GDDR7, which support PAM4 signaling. The transmitter architecture included herein is extremely power efficient and makes it possible to design a High speed PAM4 transmitter for a GDDR7 interface with excellent power efficiency. The transition level dependent boosting scheme included herein helps to increase the bandwidth of transmitter.

In some embodiments, the driver strength of the MSB main driver may be twice the drive strength of LSB main driver. The drive strength of MSB boost driver may be twice the drive strength of LSB boost driver. The effective boosting at the PAD may be transition level dependent.

It will be apparent to those skilled in the art that various modifications and variations can be made in embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A transmitter circuit comprising:
a most significant bit ("MSB") main driver;
a most significant bit boost driver operatively connected to the MSB main driver;
a least significant bit ("LSB") main driver; and
a least significant bit boost driver operatively connected to the LSB main driver, wherein the MSB main driver and the LSB main driver are configured to receive two parallel non-return-to-zero ("NRZ") data inputs, wherein the MSB boost driver applies a boost based upon, at least in part, a pulse amplitude modulation 4-level ("PAM 4") transition level and wherein a magnitude of the boost differs between each of the 4 PAM4 transition levels.

2. The transmitter circuit of claim 1, wherein the transmitter circuit generates a PAM4 compliant output signal.

3. The transmitter circuit of claim 1, wherein a drive strength of the MSB main driver is twice a drive strength of the LSB main driver.

4. The transmitter circuit of claim 1, wherein a first NRZ data input is received at the MSB main driver and the MSB boost driver.

5. The transmitter circuit of claim 1, wherein a second NRZ data input is received at the LSB main driver and the LSB boost driver.

6. The transmitter circuit of claim 1, wherein the two parallel NRZ data inputs are generated at a serializer.

7. The transmitter circuit of claim 1, wherein the MSB main driver and LSB main driver are connected in parallel.

8. The transmitter circuit of claim 6, wherein the serializer is an 8-bit input data serializer at an X/8 rate, wherein "X" is full speed.

9. The transmitter circuit of claim 8, wherein the two parallel NRZ data inputs are at X/2, wherein "X" is full speed.

10. A PAM4 data transmission method comprising:
providing a most significant bit ("MSB") main driver and a most significant bit boost driver operatively connected to the MSB main driver;
providing a least significant bit ("LSB") main driver and a least significant bit boost driver operatively connected to the LSB main driver;
receiving two parallel non-return-to-zero ("NRZ") data inputs at the MSB main driver and the LSB main driver; and
generating a PAM4 output signal, wherein the MSB boost driver applies a boost based upon, at least in part, a pulse amplitude modulation 4-level ("PAM 4") transition level and wherein a magnitude of the boost differs between each of the 4 PAM4 transition levels.

11. The data transmission method of claim 10, wherein at least one of the MSB main driver and the LSB main driver include a pull-up pre-driver, a pull-down pre-driver, and a PVT compensated output driver.

12. The data transmission method of claim 10, wherein a drive strength of the MSB main driver is twice a drive strength of the LSB main driver.

13. The data transmission method of claim 10, wherein a first NRZ data input is received at the MSB main driver and the MSB boost driver.

14. The data transmission method of claim 10, wherein a second NRZ data input is received at the LSB main driver and the LSB boost driver.

15. The data transmission method of claim 10, wherein the two parallel NRZ data inputs are generated at a serializer.

16. The data transmission method of claim 10, wherein the MSB main driver and LSB main driver are connected in parallel.

17. The data transmission method of claim 15, wherein the serializer is an 8-bit input data serializer at an X/8 rate, wherein "X" is full speed.

18. The data transmission method of claim 17, wherein the two parallel NRZ data inputs are at X/2, wherein "X" is full speed.

* * * * *